United States Patent
Liao et al.

(10) Patent No.: US 11,277,917 B2
(45) Date of Patent: Mar. 15, 2022

(54) EMBEDDED COMPONENT PACKAGE STRUCTURE, EMBEDDED TYPE PANEL SUBSTRATE AND MANUFACTURING METHOD THEREOF

(71) Applicant: ADVANCED SEMICONDUCTOR ENGINEERING, INC., Kaohsiung (TW)

(72) Inventors: Yu-Ju Liao, Kaohsiung (TW); Chien-Fan Chen, Kaohsiung (TW); Chien-Hao Wang, Kaohsiung (TW); I-Chia Lin, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/351,026

(22) Filed: Mar. 12, 2019

(65) Prior Publication Data
US 2020/0296836 A1    Sep. 17, 2020

(51) Int. Cl.
*H05K 1/18*    (2006.01)
*H01L 21/48*    (2006.01)
*H01L 23/00*    (2006.01)
*H01L 23/498*    (2006.01)

(52) U.S. Cl.
CPC .......... *H05K 1/186* (2013.01); *H01L 21/4857* (2013.01); *H01L 23/49822* (2013.01); *H01L 24/03* (2013.01); *H01L 24/06* (2013.01); *H01L 2224/24137* (2013.01)

(58) Field of Classification Search
CPC ............... H05K 1/186; H01L 21/4857; H01L 23/49822; H01L 24/03; H01L 24/06; H01L 2224/24137

USPC ........................................................ 174/260
See application file for complete search history.

(56) References Cited

U.S. PATENT DOCUMENTS

| 9,406,658 | B2 | 8/2016 | Lee et al. |
| 10,283,439 | B2 * | 5/2019 | Cho .................. H01L 23/5226 |
| 2002/0009577 | A1 | 1/2002 | Takaya et al. |
| 2002/0122934 | A1 | 9/2002 | Takaya et al. |
| 2004/0113719 | A1 | 6/2004 | Nakai et al. |

(Continued)

FOREIGN PATENT DOCUMENTS

| JP | 2010-232648 A | 10/2010 |
| JP | 2012-084891 A | 4/2012 |

(Continued)

OTHER PUBLICATIONS

Office Action from corresponding Japanese Patent Application No. 2019-124741, dated Dec. 1, 2020, 8 pages (with English translation).

(Continued)

*Primary Examiner* — Tremesha S Willis
(74) *Attorney, Agent, or Firm* — Foley & Lardner LLP (57) ABSTRACT

An embedded component package structure including a circuit substrate, an embedded component and a stress compensation layer is provided. The circuit substrate includes a core layer and an asymmetric circuit structure, and the core layer has a first thickness. The embedded component is disposed in the core layer. The stress compensation layer is disposed on one side of the core layer, and the stress compensation layer has a second thickness between 4 μm and 351 μm.

10 Claims, 7 Drawing Sheets

(56) References Cited

U.S. PATENT DOCUMENTS

| | | |
|---|---|---|
| 2004/0152426 A1 | 8/2004 | Suzuki et al. |
| 2004/0233644 A1 | 11/2004 | Ajioka et al. |
| 2004/0233648 A1 | 11/2004 | Ajioka et al. |
| 2005/0029642 A1 | 2/2005 | Takaya et al. |
| 2005/0068757 A1* | 3/2005 | Jayaraman ........ H01L 23/49816 361/803 |
| 2006/0057341 A1 | 3/2006 | Kawabata et al. |
| 2007/0057366 A1 | 3/2007 | Katsumata et al. |
| 2007/0069363 A1 | 3/2007 | Kawabata et al. |
| 2007/0076320 A1 | 4/2007 | Endo et al. |
| 2007/0119541 A1 | 5/2007 | Kawabata et al. |
| 2007/0141759 A1 | 6/2007 | Nagase et al. |
| 2008/0055859 A1 | 3/2008 | Furukawa et al. |
| 2008/0149379 A1 | 6/2008 | Nagase et al. |
| 2008/0202803 A1 | 8/2008 | Nagase et al. |
| 2008/0211086 A1 | 9/2008 | Morita |
| 2008/0211143 A1 | 9/2008 | Morita |
| 2009/0025965 A1 | 1/2009 | Kanemaru et al. |
| 2009/0025971 A1 | 1/2009 | Kanemaru et al. |
| 2009/0134490 A1 | 5/2009 | Furukawa et al. |
| 2009/0211799 A1 | 8/2009 | Nagase et al. |
| 2009/0218678 A1 | 9/2009 | Kawabata et al. |
| 2009/0237059 A1 | 9/2009 | Chiba |
| 2010/0013103 A1 | 1/2010 | Kawabata et al. |
| 2010/0051189 A1 | 3/2010 | Kawabata et al. |
| 2010/0083490 A1 | 4/2010 | Kawabata et al. |
| 2010/0178737 A1 | 7/2010 | Kawabata et al. |
| 2010/0246151 A1 | 9/2010 | Furukawa et al. |
| 2010/0265632 A1 | 10/2010 | Saita et al. |
| 2011/0048780 A1* | 3/2011 | Jeong ................ H01L 23/5389 427/99.2 |
| 2011/0234196 A1 | 9/2011 | Chiba |
| 2012/0044652 A1 | 2/2012 | Horikawa et al. |
| 2012/0085572 A1 | 4/2012 | Sakai |
| 2012/0247819 A1 | 10/2012 | Tsuyutani et al. |
| 2012/0285013 A1 | 11/2012 | Kanemaru et al. |
| 2013/0050967 A1* | 2/2013 | Ohshima ................ H05K 1/185 361/764 |
| 2014/0070396 A1 | 3/2014 | Kyozuka et al. |
| 2014/0085854 A1 | 3/2014 | Tsuyutani et al. |
| 2014/0104803 A1 | 4/2014 | Tsuyutani |
| 2014/0182895 A1 | 7/2014 | Lee et al. |
| 2014/0333274 A1 | 11/2014 | Abe et al. |
| 2015/0062809 A1 | 3/2015 | Yokoyama et al. |
| 2015/0145145 A1 | 5/2015 | Tsuyutani et al. |
| 2016/0351486 A1* | 12/2016 | Jung ...................... H01L 28/40 |
| 2017/0025324 A1 | 1/2017 | Yamaki et al. |
| 2017/0295643 A1 | 10/2017 | Suzuki et al. |
| 2018/0027660 A1 | 1/2018 | Yoshida et al. |
| 2018/0132355 A1 | 5/2018 | Saita et al. |
| 2018/0233553 A1 | 8/2018 | Tomikawa et al. |
| 2018/0235086 A1 | 8/2018 | Tomikawa et al. |
| 2018/0337131 A1 | 11/2018 | Tsuyutani et al. |
| 2020/0045825 A1* | 2/2020 | Wu ........................ H05K 1/036 |

FOREIGN PATENT DOCUMENTS

| | | |
|---|---|---|
| JP | 2014-056925 A | 3/2014 |
| JP | 2014-131040 A | 7/2014 |
| JP | 2015233160 A | 12/2015 |
| JP | 2017157681 A | 9/2017 |
| JP | 2018133363 A | 8/2018 |
| WO | 2018180628 A1 | 10/2018 |

OTHER PUBLICATIONS

Office Action from corresponding Japanese Patent Application No. 2019-124741, dated Apr. 27, 2021, 11 pages (with English translation).

* cited by examiner

FIG. 1

(a) Original design

| Layers | CCL thickness (T1) | Core thickness (T2) | Thickness ratio (T1/T2) | Warpage (panel form) | Residual Cu ratio /thickness |
|---|---|---|---|---|---|
| 2L+1L | 30±5μm | 121(±10)μm | 0.2~0.29 | 19~25 mm | Not considered |
| 1L+2L | 30±5μm | | 0.2~0.29 | 21~26 mm | Not considered |
| 2L | 30±5μm or 40±5μm | | 0.2~0.37 | 15~21 mm | Not considered |
| 1L | 30±5μm or 40±5μm | | 0.2~0.37 | 21~28 mm | Not considered |

(b) New design

| Layers | CCL thickness (T1) | Core thickness (T2) | Thickness ratio (T1/T2) | Warpage (panel form) | Residual Cu ratio /thickness |
|---|---|---|---|---|---|
| 2L+1L | 34~171(±12)μm | 121(±10)μm | 0.18~1.152 | 2~4 mm | 10%~95%/10~30μm |
| 1L+2L | 81~339(±12)μm | | 0.57~2.90 | 3~4 mm | 10%~95%/10~30μm |
| 2L | 51~300(±12)μm | | 0.42~2.58 | 0~2 mm | 10%~95%/10~30μm |
| 1L | 16~129(±12)μm | | 0.03~1.17 | 2~5 mm | 10%~95%/10~30μm |

EMBEDDED COMPONENT PACKAGE STRUCTURE, EMBEDDED TYPE PANEL SUBSTRATE AND MANUFACTURING METHOD THEREOF

BACKGROUND OF THE INVENTION

Field of the Invention

The invention relates in general to a component package structure and a manufacturing method thereof, and more particularly to an embedded component package structure, an embedded type panel substrate and a manufacturing method thereof.

Description of the Related Art

In a system-level package structure, a semiconductor embedded in substrate technology that embeds a semiconductor chip into a package substrate has advantages of reduced noise interference upon a package structure as well as reduced a size of product, and has thus become a focus of research and development of manufacturers in the field. To enhance the yield rate of production, it is necessary to fix an embedded component in a core layer of the circuit substrate to facilitate electrical connection between patterned conductive layers and the embedded component in subsequent process.

Further, in order to reduce the warpage of the circuit substrate, the circuit substrate is provided with the same number of conductive layers above and below the embedded component, and thus the amount of copper used for the circuit substrate is increased and fails to cost down.

SUMMARY OF THE INVENTION

It is therefore an object of the invention to provide an embedded component package structure, an embedded type panel substrate, and a manufacturing method thereof, which can reduce production cost and reduce the warpage of the panel substrate.

According to another embodiment, an embedded component package structure including a circuit substrate, an embedded component and a stress compensation layer is provided. The circuit substrate includes a core layer and an asymmetric circuit structure, and the core layer has a first thickness. The embedded component is disposed in the core layer. The stress compensation layer is disposed on one side of the core layer, the stress compensation layer has a second thickness between 4 and 351 μm.

According to another embodiment, an embedded substrate strip including a plurality of circuit substrate units, a plurality of embedded components and a stress compensation layer is provided. Each of the circuit substrate units has a core layer and an asymmetric circuit structure, and the core layer has a first thickness. The plurality of embedded components is disposed in the core layers. The stress compensation layer is disposed on one side of the circuit substrate units, wherein the stress compensation layer has a second thickness, and the embedded substrate strip has a warpage less than 5 mm.

According to another embodiment, a manufacturing method of an embedded component package structure is provided as followings. a stress compensation layer is provided on one side of a core layer, wherein the core layer has a first thickness and the stress compensation layer has a second thickness. An electrical component is disposed in the core layer. An asymmetric circuit structure is formed above and below the electrical component.

Other objects, features, and advantages of the invention will become apparent from the following detailed description of the preferred but non-limiting embodiments. The following description is made with reference to the accompanying drawings.

DETAILED DESCRIPTION OF THE INVENTION

Details are given in the non-limiting embodiments below. It should be noted that the embodiments are illustrative examples and are not to be construed as limitations to the claimed scope of the present invention. The same/similar denotations are used to represent the same/similar components in the description below. Directional terms such as above, below, left, right, front or back are used in the following embodiments to indicate the directions of the accompanying drawings, not for limiting the present invention.

According to an embodiment of the present invention, an embedded component package structure is provided to improve an asymmetric stress distribution generated by an asymmetric circuit structure above and below the embedded component, and thereby the problem of warpage of the panel substrate can be resolved.

The asymmetric circuit structure has different numbers of conductive layers above and below the embedded component, for example, the upper conductive layer is 2 layers or more/the lower conductive layer is 1 layer (indicated by 2L+1L), the upper conductive layer is 1 layer/the lower conductive layer is 2 layers or more (indicated by 1L+2L), the upper conductive layer is 2 layers or more/no lower conductive layer (indicated by 2L), the upper conductive layer is 1 layer/no lower conductive layer (indicated by 1L) or other combinations.

The above combinations are only illustrative examples, and the present invention is not limited thereto. Referring to the list of the combinations in FIG. 1 and FIG. 2, the number of the upper conductive layer and the lower conductive layer of the asymmetric circuit structure may be one of at least four sets of asymmetric combinations, such as 2L+1L, 1L+2L, 2L, and 1L. The different combination types of asymmetric circuit structures have different amounts of warpage for the panel substrate. Therefore, the present embodiment customizes the stress compensation layers of different thicknesses according to different combinations of asymmetric circuit structures to effectively suppress the warpage of the panel substrate to be less than 5 mm. In the embodiment, the panel substrate may be an elongated substrate or a two-dimensional array substrate including a plurality of circuit substrate units and a plurality of embedded components disposed therein.

Figure 1:
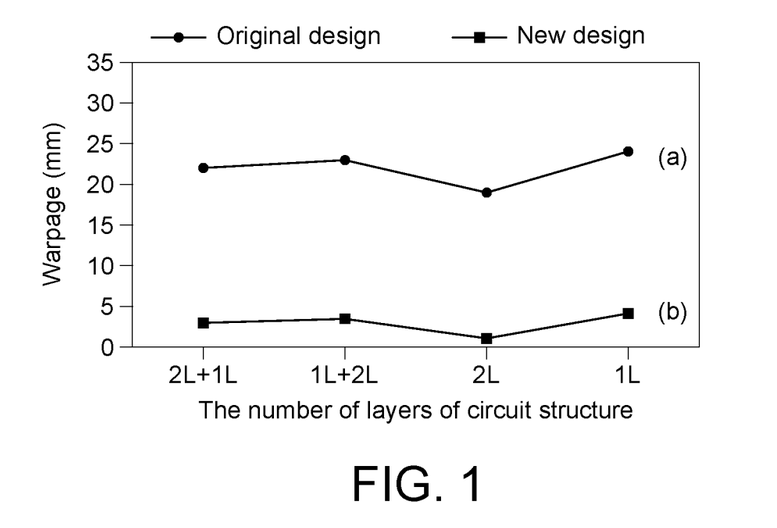
FIG. 1 is a diagram showing the relationship between the number of layers of the circuit structure and the amount of warpage of original design and the improved structure of new design.
Figure 2:
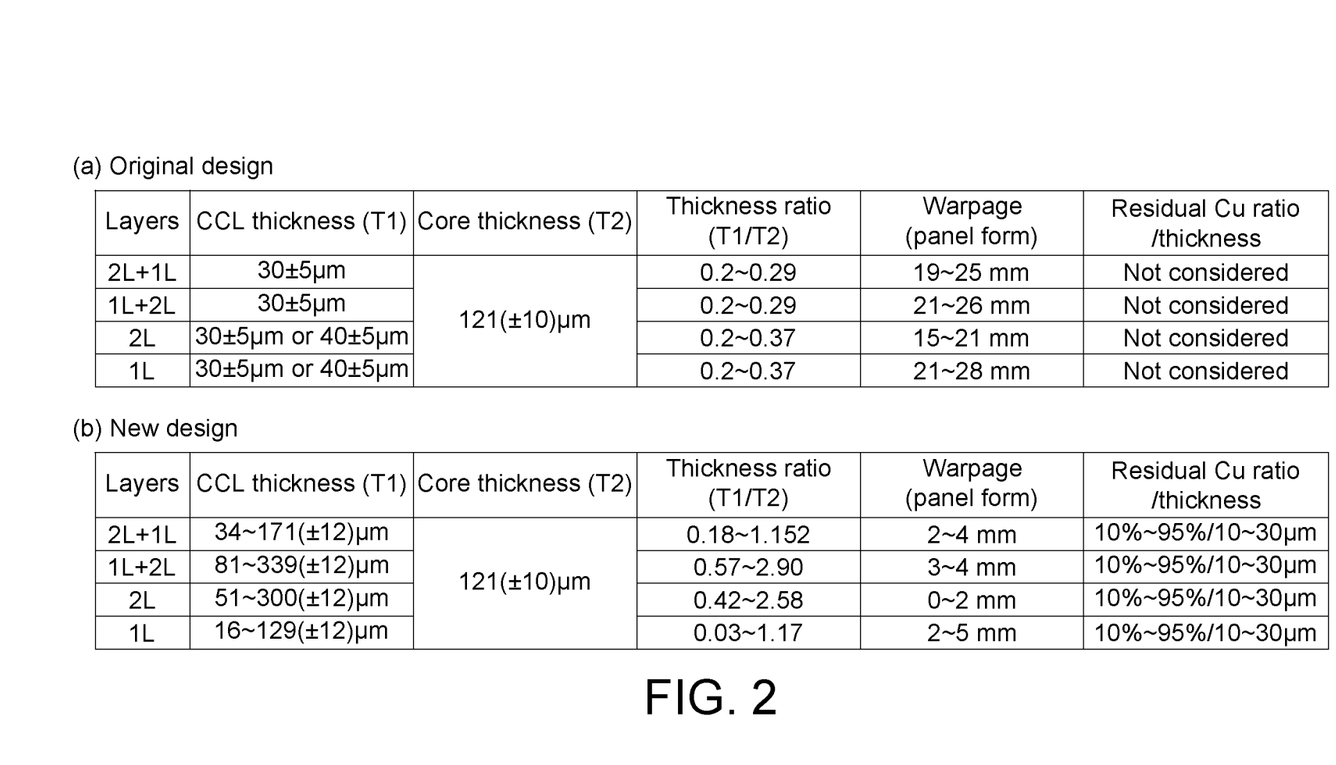
FIG. 2 is a comparison table showing the relationship among the number of layers of the circuit substrate, the thickness of the stress compensation layer, the thickness of the core layer, the thickness ratio, the amount of warpage, and the residual copper ratio of original design and the improved structure of new design.

Referring to FIGS. 1 and 2, in the package structure of original design (a), when the number of upper conductive layer and lower conductive layer is 2L+1L, the warpage of the panel substrate is 19-25 mm, which is far larger than the allowable amount of warpage of 5-10 mm. However, after the stress compensation layer is added to the improved package structure (b), the amount of warpage of the panel substrate can be reduced to 2-4 mm, which is less than the allowable amount of warpage of 5-10 mm.

In addition, in the package structure of original design (a), when the number of the upper conductive layer and the lower conductive layer is 1L+2L, the warpage of the panel substrate is 21-26 mm, which is far larger than the allowable amount of warpage of 5-10 mm. However, after the stress compensation layer is added to the improved package structure (b), the amount of warpage of the panel substrate can be reduced to 3-4 mm, which is less than the allowable amount of warpage of 5-10 mm.

In addition, in the package structure of original design (a), when the number of the upper conductive layer and the lower conductive layer is 2L (without the lower conductive layer), the warpage of the panel substrate is 15-21 mm, which is far larger than the allowable amount of warpage of 5-10 mm. However, after the stress compensation layer is added to the improved package structure (b), the amount of warpage of the panel substrate can be reduced to 0-2 mm, which is less than the allowable amount of warpage of 5-10 mm.

Furthermore, in the package structure of original design (a), when the number of the upper conductive layer and the lower conductive layer is 1L (without the lower conductive layer), the warpage of the panel substrate is 21-28 mm, which is far larger than the allowable amount of warpage of 5-10 mm. However, after the stress compensation layer is added to the improved package structure (b), the warpage of the panel substrate can be reduced to 2-5 mm, which is less than the allowable amount warpage of 10 mm.

It can be seen from the above table that the present embodiment can customize the stress compensation layers of different thicknesses according to different asymmetric combinations to effectively suppress the warpage of the panel substrate to be less than 5 mm. Please refer to FIG. 2, in the structure of original design (a), because the thickness of the copper clad laminate (CCL) is fixed, between 30 +/−5 μm or 40 +/−5 μm, and is not considered the effect of the residual copper ratio and the thickness of each conductive layer to the amount of warpage, and thus the amount of warpage is much larger than the allowable amount of warpage of 5-10 mm, thereby cannot be lowered. In contrast, in the improved package structure (b) of new design, since the thickness of the copper clad laminate (CCL) is a non-fixed value, which may be between 4 μm and 351 μm, and the residual copper ratio and the thickness of each conductive layer are further considered in the present embodiment, so that the amount of warpage after improvement can be less than 5 mm.

As shown in FIG. 2, when the number of the upper conductive layer and the lower conductive layer are 2L+1L, 1L+2L, 2L, 1L, etc., the thicknesses of the CCL substrate are between 34-171 (+/−12) μm, 81-339 (+/−12) μm, 51-300 (+/−12) μm, and 16-129 (+/−12) μm, respectively, where +/−12 μm is a tolerance value. In addition, when the number of the upper conductive layer and the lower conductive layer are 2L+1L, 1L+2L, 2L, 1L, etc., the ratios of the thickness (T1) of the CCL substrate to the thickness (T2) of the core layer are between 0.18-1.152, 0.57-2.90, 0.42-2.58 and 0.03-1.17, respectively. The thickness of the core layer is a fixed value, for example, 121 +/−10 μm, and the thickness of the core layer can be adjusted according to actual needs.

In the present embodiment, the thickness of the CCL substrate (or the stress compensation layer referred to later) mainly depends on the residual copper ratio and thickness of each conductive layer of the asymmetric circuit structure, and therefore, when at least one of a plurality of parameters such as the number of conductive layers, the residual copper ratio, and the thickness of copper foil is changed, the thickness of the CCL substrate is changed accordingly, thereby balancing the asymmetric stress distribution of the asymmetric circuit structure on the circuit substrate.

In one embodiment, the residual copper ratio of each conductive layer is, for example, between 10% and 95%, and the residual copper ratio refers to the ratio of the area after the copper layer is patterned into a circuit to the area of entire non-patterned copper layer. The residual copper ratio of the original copper layer without patterning is set to 100%. Further, the thickness of each conductive layer is, for example, between 10 μm and 30 μm. In general, the increase in residual copper ratio or thickness may increase the degree of influence on the stress of the circuit substrate, but it is still necessary to further compare the difference in the number of conductive layers above and below the core layer. Please refer to the following description.

Figure 3A:
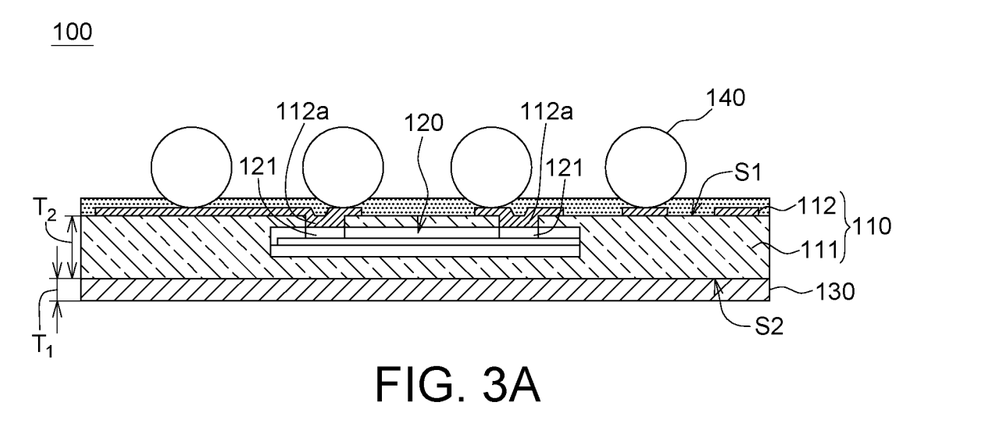
FIG. 3A is a cross-sectional view showing an embedded component package structure according to an embodiment of the present invention.

Referring to FIG. 3A, which illustrates an embedded component package structure 100 including a circuit substrate 110, an embedded component 120, and a stress compensation layer 130. The circuit substrate 110 has a core layer 111 and an upper conductive layer 112, and the core layer 111 has a first thickness (shown as T2 in FIG. 2). The embedded element 120 is disposed in the core layer 111. The core layer 111 has a first surface S1 (or a first side) and a second surface S2 (or a second side) opposite to the first surface S1. The upper conductive layer 112 is disposed on the first surface S1, and the upper conductive layer 112 and the embedded component 120 are electrically connected. That is, the electrical contacts 112a of the upper conductive layer 112 and the corresponding electrical pads 121 of the embedded component 120 are in contact with each other to be electrically connected. In addition, in this embodiment, a plurality of solder balls 140 are disposed on the circuit substrate 110 and electrically connected to the upper conductive layer 112 to form the embedded component package structure 100 of ball grid array type.

The asymmetric circuit structure in FIG. 3A has only a single upper conductive layer 112, which is located above the embedded element 120. Therefore, in this embodiment, a stress compensation layer 130 is disposed under the embedded element 120, that is, on the second surface S2 of the core layer 111, to balance the stress distribution above and below the embedded component 120.

The stress compensation layer 130 is, for example, a layer of dielectric material containing glass fibers, and no copper layer is overlaid on the stress compensation layer 130. Since the stress compensation layer 130 has strong rigidity after curing the dielectric material, the circuit substrate 110 can be prevented from being bent upward, so that the warpage of the circuit substrate 110 can be effectively reduced. In another embodiment, the stress compensation layer 130 may also be made of a composite material, a nano material or a metal material having a predetermined strength, and the present invention is not limited thereto.

According to the numerical values in FIG. 2, the thickness (indicated by T1 in FIG. 2) of the stress compensation layer 130 in FIG. 3A is, for example, between 16-129 (+/−12) μm, and the ratio (T1/T2) of the thickness of the stress compensation layer 130 to the thickness of the core layer 111 is, for example, between 0.03-1.17.

For example, the densities of the resin material and the glass fiber of the stress compensation layer 130 are 1.1 g/cm³ and 2.5 g/cm³ respectively, the resin ratio is 50%, the glass fiber ratio is 50%, and the copper density of the upper conductive layer 112 is 8.9. g/cm³, the residual copper ratio is 65%, and the copper thickness is 13.6 μm. The thickness of the stress compensation layer 130 can be expressed as: (copper thickness of the upper conductive layer×residual copper ratio×copper density)/((resin ratio×resin density)+(glass fiber ratio×glass fiber density)), i.e., (13.6 μm×65%×8.9)/(50%×1.1+50%×2.5)=43.7 μm. In another embodiment, when the residual copper ratio becomes 95%, the thickness of the stress compensation layer 130 is relatively increased to 63.88 μm. In another embodiment, when the residual copper ratio becomes 95% and the copper thickness becomes 30 μm, the thickness of the stress compensation layer 130 is relatively increased to 141 μm. In the other hand, when the residual copper ratio becomes 10% and the copper thickness becomes 10 μm, the thickness of the stress compensation layer 130 is relatively reduced to 4 μm.

Figure 3B:
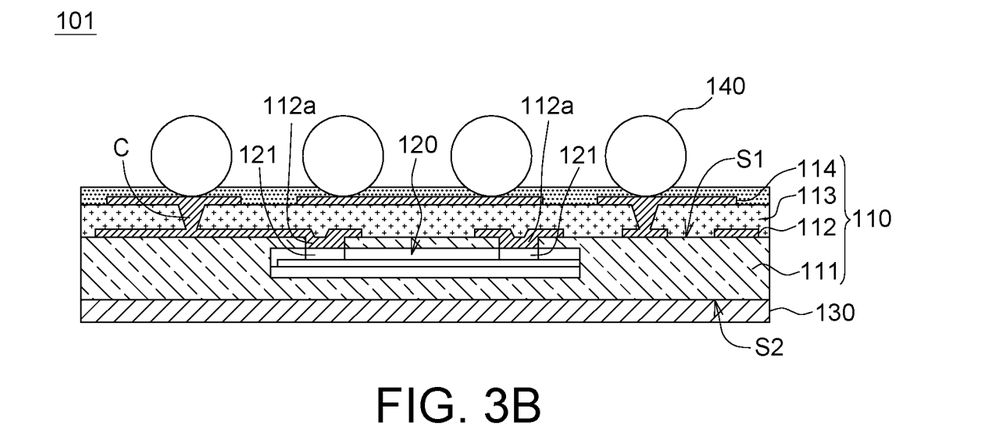
FIG. 3B is a cross-sectional view showing an embedded component package structure according to another embodiment of the present invention.

Referring to FIG. 3B, an embedded component package structure 101 includes a circuit substrate 110, an embedded component 120 and a stress compensation layer 130. The circuit substrate 110 has a core layer 111, two upper conductive layers 112, 114, and a dielectric material layer 113. The core layer 111 has a first thickness. The embedded element 120 is disposed in the core layer 111 of the circuit substrate 110. The core layer 111 has a first surface S1 and a second surface S2 opposite to each other. The upper conductive layer 112 is disposed on the first surface S1 of the core layer 111, and the upper conductive layer 112 is electrically connected to the embedded component 120. The upper conductive layer 114 is disposed on the dielectric material layer 113. The two conductive layers 112 and 114 are electrically connected to each other with the conductive pillars C penetrating through the dielectric material layer 113. The dielectric material layer 113 is disposed between the two upper conductive layers 112 and 114. In addition, in the present embodiment, a plurality of solder balls 140 are disposed on the circuit substrate 110 and electrically connected to the upper conductive layers 112 and 114 to form the embedded component package structure 101 of the ball grid array type, as described above.

The asymmetric circuit structure in FIG. 3B has two upper conductive layers 112 and 114 located above the embedded component 120. Therefore, in this embodiment, a stress compensation layer 130 is disposed below the embedded component 120, that is, on the second surface S2 of the core layer 111 to balance the stress distribution above and below the embedded component 120. The number of the upper conductive layers 112 and 114 is not limited to two layers, and may be more than two layers.

According to the numerical values in FIG. 2, the thickness of the stress compensation layer 130 (indicated by T1 in FIG. 2) in FIG. 3B is, for example, between 51-300 (+/−12) μm, and the ratio (T1/T2) of the thickness of the stress compensation layer 130 to the thickness of the core layer 111 is, for example, between 0.42 and 2.58. The thickness of the stress compensation layer 130 in FIG. 3B mainly depends on (copper thickness the of upper conductive layer×residual copper ratio×copper density)/((resin ratio×resin density)+(glass fiber ratio×glass fiber density)) and the thickness of the dielectric material layer 113, the formula of which is described as above and will not be described again herein. The material of the dielectric material layer 113 may be the same as the dielectric material of the stress compensation layer 130, for example, a dielectric material having the same glass fiber ratio, and therefore, when the thickness of the dielectric material layer 113 is increased (for example, 2 or 3 layers), the thickness of the stress compensation layer 130 needs to be increased accordingly to achieve stress balance.

Figure 3C:
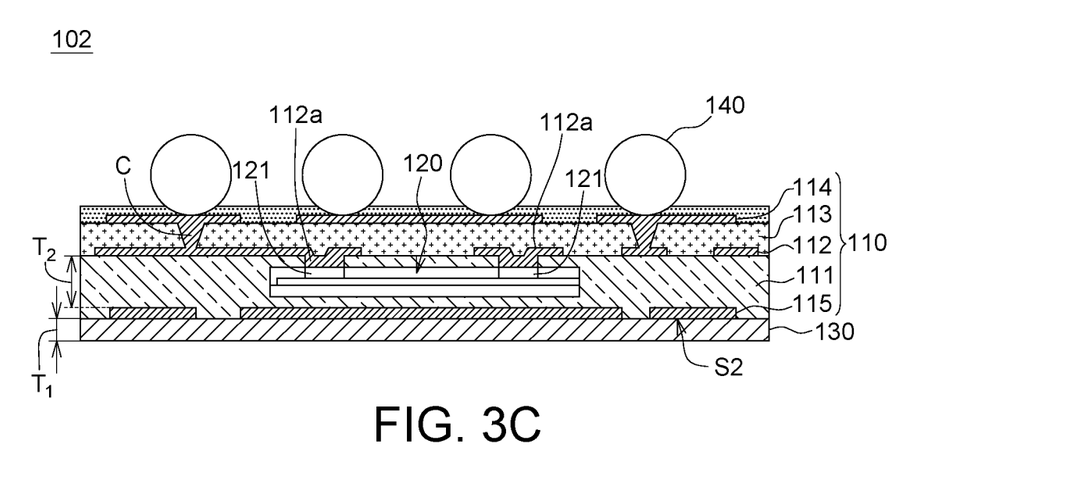
FIG. 3C is a cross-sectional view showing an embedded component package structure according to another embodiment of the present invention.

Referring to FIG. 3C, an embedded component package structure 102 includes a circuit substrate 110, an embedded component 120, and a stress compensation layer 130. The circuit substrate 110 has a core layer 111, two upper conductive layers 112, 114, a dielectric material layer 113, and a lower conductive layer 115. A dielectric material layer 113 is disposed between the two upper conductive layers 112 and 114. The difference between the present embodiment and the above embodiment is that the lower conductive layer 115 is further disposed on the second surface S2 of the core layer 111, and the remaining components are denoted by the same denotations and will not be described again herein.

The asymmetric circuit structure in FIG. 3C has two upper conductive layers 112, 114 and a lower conductive layer 115, which are respectively located above and below the embedded component 120. Therefore, in this embodiment, a stress compensation layer 130 is disposed below the embedded component 120, that is, on the second surface S2 of the core layer 111 and located on the same side of the core layer 111 with the lower conductive layer 115 for balancing the stress distribution above and below the embedded component 120.

According to the numerical values in FIG. 2, the thickness (indicated by T1 in FIG. 2) of the stress compensation layer 130 in FIG. 3C is, for example, between 34 and 171 (+/−12) μm, and the ratio of the thickness of the stress compensation layer 130 to the thickness of the core layer 111 (T1/T2) is, for example, between 0.18 and 1.152. The thickness of the stress compensation layer 130 in FIG. 3C mainly depends on ((copper thickness of the upper conductive layer×residual copper ratio×copper density)−(copper thickness of the lower conductive layer×residual copper ratio×copper density))/((resin ratio)×resin density)+(glass fiber ratio×glass fiber density)) and the thickness of the dielectric material layer 113, the formula of which is described as above. In this embodiment, since the stresses of the first upper conductive layer 112 of the two upper conductive layers 112, 114 and the lower conductive layer 115 cancel each other, only the asymmetric stress generated by the second upper conductive layer 114 and the dielectric material layer 113 are considered. Further, when the thickness of the dielectric material layer 113 is increased (for example, 2 layers or 3 layers), the thickness of the stress compensation layer 130 needs to be increased accordingly to achieve stress balance, as described above.

Figure 3D:
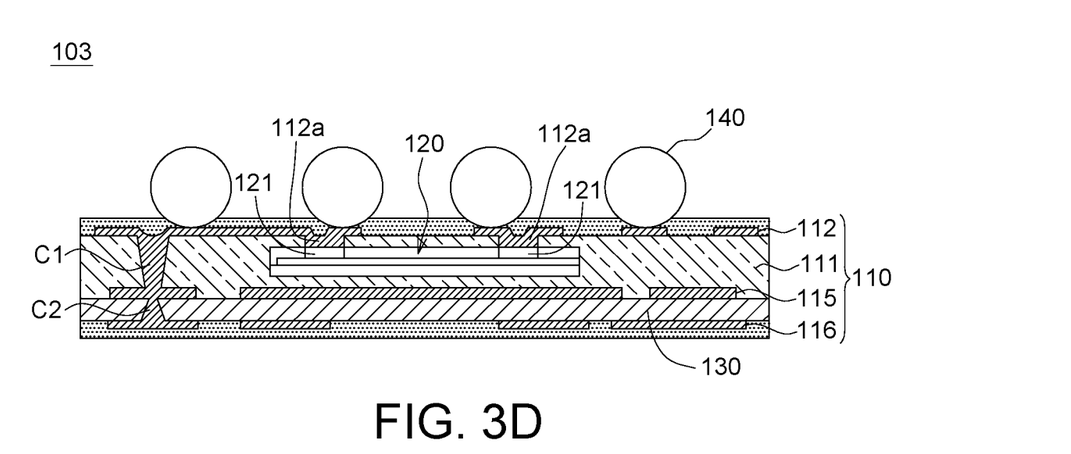
FIG. 3D is a cross-sectional view showing an embedded component package structure according to another embodiment of the present invention.

Referring to FIG. 3D, an embedded component package structure 103 includes a circuit substrate 110, an embedded component 120, and a stress compensation layer 130. The circuit substrate 110 has a core layer 111, an upper conductive layer 112 and two lower conductive layers 115, 116. The upper conductive layer 112 is disposed above the core layer 111, and the two lower conductive layers 115, 116 are located below the core layer 111. The upper conductive layer 112 and the two lower conductive layers 115, 116 are electrically connected to each other, for example, through the conductive pillar C1 penetrating the core layer 111 and the conductive pillar C2 penetrating the stress compensation layer 130. The stress compensation layer 130 is disposed between the two lower conductive layers 115, 116, and the stress compensation layer 130 and the two lower conductive layers 115, 116 are all located on the same side of the core layer 111.

The asymmetric circuit structure in FIG. 3D has an upper conductive layer 112 and two lower conductive layers 115 and 116 above and below the embedded component 120 respectively. The first lower conductive layer 115 is located below the embedded component 120, but a tensile stress generated by the first lower conductive layer 115 is to bend the circuit substrate 110 downward, and a tensile stress generated by the second lower conductive layer 116 is to bend the circuit substrate 110 upward, and both of the two stresses can be balanced to each other. Therefore, in the present embodiment, the thickness of the stress compensation layer 130 mainly depends on the residual copper ratio and thickness of the upper conductive layer 112 and the thickness of the core layer 111. In addition, the number of the lower conductive layers 115 is not limited to two layers, and may be more than two layers.

According to the numerical values in FIG. 2, the thickness of the stress compensation layer 130 in FIG. 3D (indicated by T1 in FIG. 2) is, for example, between 81-339 (+/−12) μm, and the stress The ratio (T1/T2) of the thickness of the stress compensation layer 130 to the thickness of the core layer 111 is, for example, between 0.59 and 2.90. The thickness of the stress compensation layer 130 in FIG. 3D mainly depends on ((upper conductive layer copper thickness×residual copper ratio×copper density)+(first lower conductive layer copper thickness×residual copper ratio×copper density)−(second lower conductive layer copper thickness×residual copper ratio×copper density)+(thickness of core layer))/((resin ratio×resin density)+(glass fiber ratio×glass fiber density)) and thickness of dielectric material layer 113, the formula of which is described as above. In the present embodiment, since the stresses of the first lower conductive layer 115 and the second lower conductive layer 116 cancel each other, only the asymmetric stress generated by the upper conductive layer 112 and the core layer 111 is considered.

Figure 4:
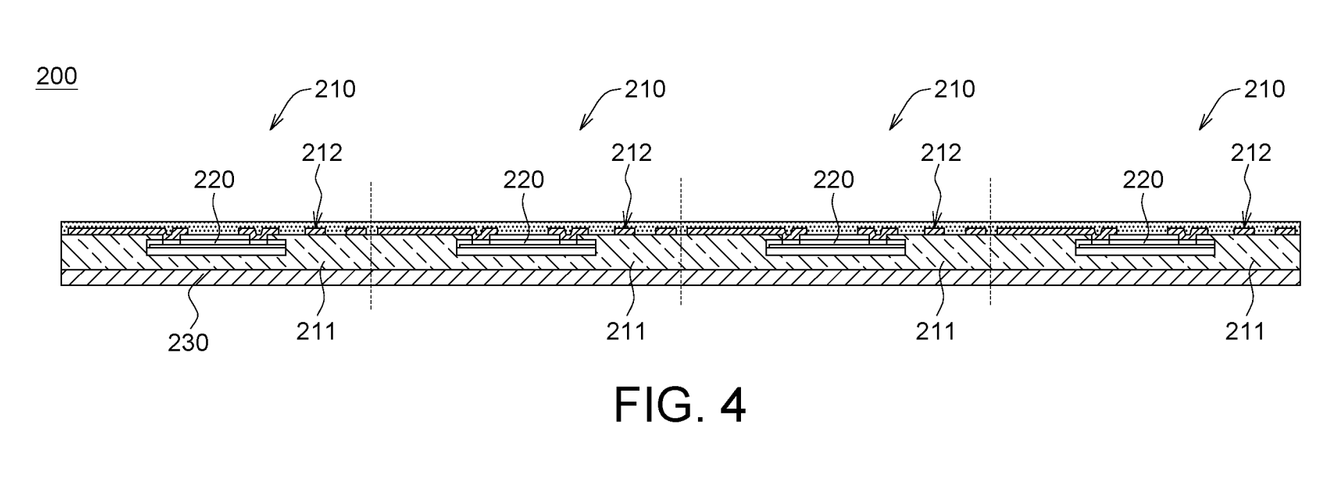
FIG. 4 is a cross-sectional view showing an embedded type panel substrate according to an embodiment of the present invention.

Referring to FIG. 4, according to the above embodiments, an embedded type panel substrate 200 including a plurality of circuit substrate units 210, a plurality of embedded components 220 and a stress compensation layer 230 is provided. The plurality of circuit substrate units 210 can be divided into a plurality of circuit substrates 110 by cutting, as shown in FIGS. 3A to 3D. The embedded type panel substrate 200 can be considered as a semi-finished product of the above-described embedded component package structures 100-103.

Each of the circuit substrate units 210 has a core layer 211 and an asymmetric circuit structure 212 (only one layer is shown). The core layer 211 has a first thickness, and the asymmetric circuit structure 212 is similar to that shown in FIGS. 3A to 3D and will not show again herein. The asymmetric circuit structure 212 generates an asymmetric stress distribution above and below the embedded component 220 and causes the embedded type panel substrate 200 to warp.

Further, the embedded element 220 is disposed in the core layer 211 of each of the circuit substrate units 210. The stress compensation layer 230 is disposed on one side of the core layer 211 for balancing the stress distribution of the asymmetric circuit structure 212, wherein the stress compensation layer 230 has a second thickness that suppresses the warpage of the embedded type panel substrate 200 less than 5 mm.

In an embodiment, the embedded type panel substrate 200 has a length dimension and a width dimension of 240.5 mm×95 mm or more. When the amount of warpage of the embedded type panel substrate 200 is greater than 5 mm, the flatness of the embedded type panel substrate 200 is degraded, and the solder paste printing process or the reflow process cannot be performed, so that the solder balls 240 (referring to FIG. 5D) cannot be fabricated or the solder balls 240 cannot be soldered to be fixed on the circuit substrate units 210. In addition, when the amount of warpage of the embedded type panel substrate 200 is greater than 5 mm, it is also disadvantageous to cut the embedded type panel substrate 200 into a plurality of circuit substrates, thereby affecting the quality of the packaged product. In addition, the present embodiment employs an asymmetric circuit structure 212, which can reduce the number of at least one conductive layer and reduce the step of patterning a conductive layer, compared to a conventional symmetric circuit structure (for example, the number of layers is 2L+2L or 1L+1L). Therefore, the production cost of the package structure of the present embodiment is relatively reduced.

Figure 5A:
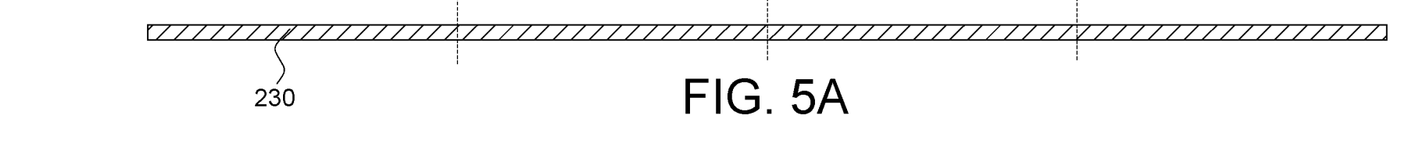
FIGS. 5A-5E are flow diagrams showing a manufacturing method of an embedded component package structure according to an embodiment of the present invention.
Figure 5B:
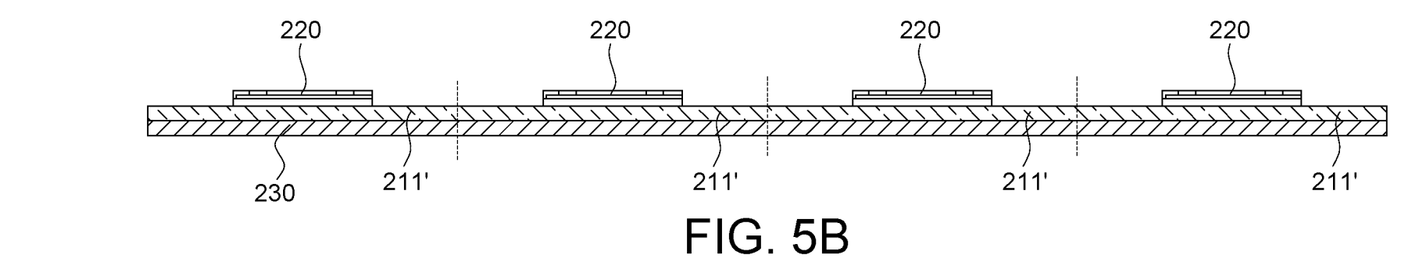
Figure 5C:
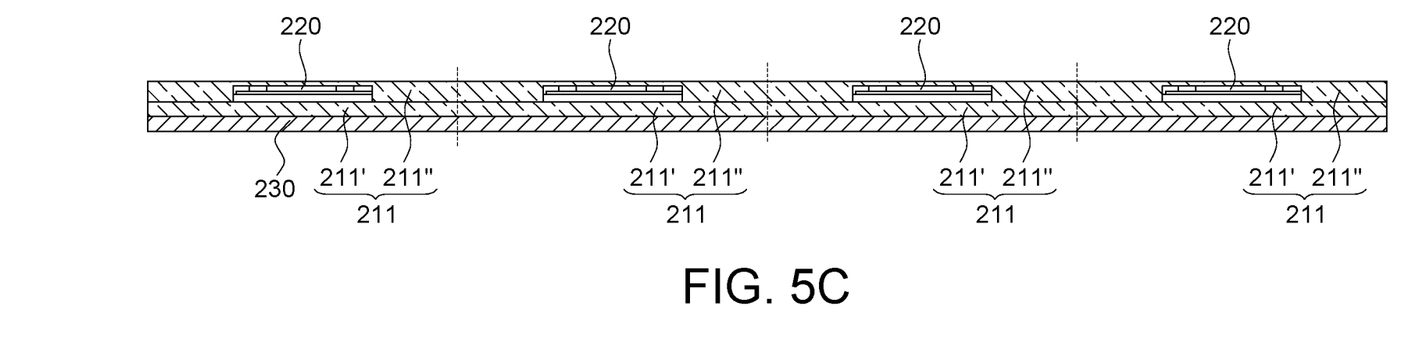
Figure 5D:
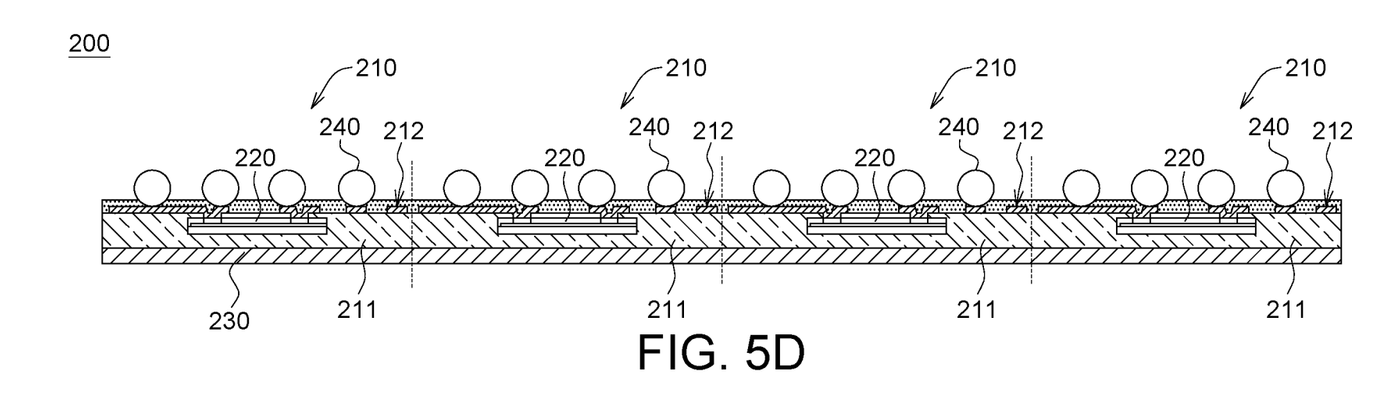
Figure 5E:
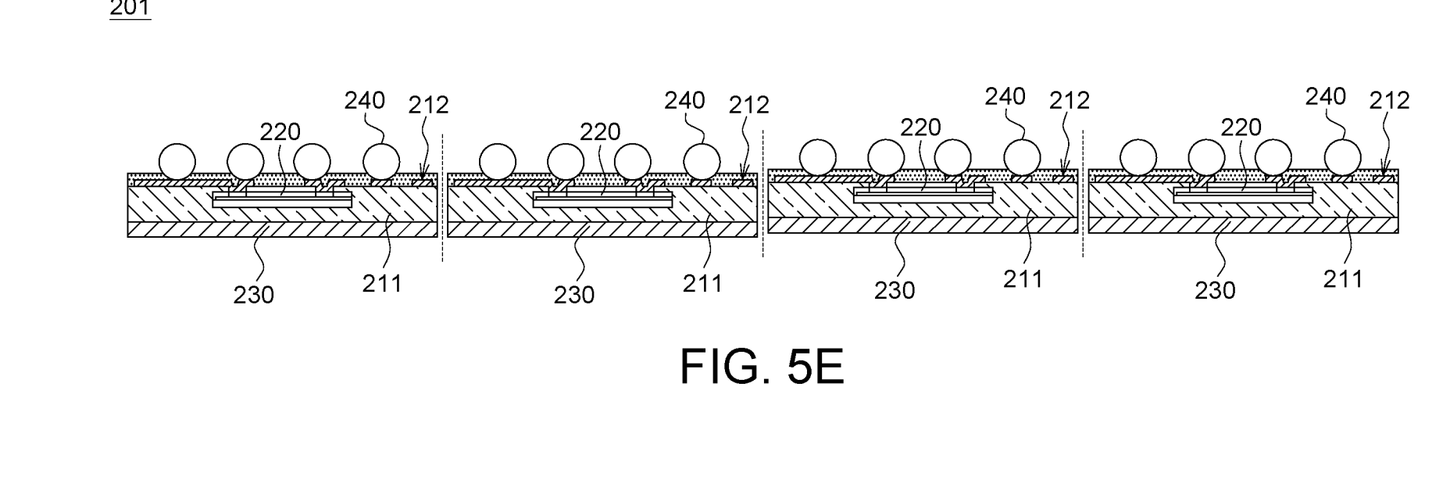

Referring to FIG. 5A to FIG. 5E, according to the above embodiments, a manufacturing method of an embedded component package structure is provided as follows. In FIG. 5A, after confirming the overall structure of the embedded component package structure and its stress distribution by a simulation result, a required thickness of a stress compensation layer 230 is determined. In FIG. 5B, an insulating material 211' is disposed on one side of the stress compensation layer 230. In FIG. 5C, an electronic component is disposed on the insulating material 211' and covered by another insulating material 211" to form an embedded component 220 in the core layer 211, wherein the core layer 211 has a first thickness, and the stress compensation layer 230 has a second thickness. In FIG. 5D, an asymmetric circuit structure 212 is formed on the core layer 211 and electrically connected to the embedded component 220. The asymmetric circuit structure 212 is not limited to one layer, and may include multiple upper conductive layers and/or multiple lower conductive layers. When the asymmetric circuit structure 212 has a lower conductive layer, the lower conductive layer may be formed on the stress compensation layer 230 first, and then the core layer 211 is formed on the lower conductive layer. In FIG. 5E, after the solder balls 240 are formed on the embedded type panel substrate 200, the circuit substrate units 210 are separated to form a plurality of embedded component package structures 201.

In an embodiment, the electronic component is, for example, an active component such as a semiconductor chip, a driving chip or a control chip, or a passive component such as a resistor, an inductor, or a capacitor.

In an embodiment of the above method, an asymmetric circuit structure may be formed on the upper and lower sides of the electronic component, and then a stress compensation layer 230 is disposed on one side of the core layer 211; or a stress compensation layer 230 is disposed on one side of the core layer 211, and then an asymmetric circuit structure is formed above and below the electronic component. The present invention is not limited thereto.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An embedded type panel substrate, comprising:
    a plurality of circuit substrate units, each of the circuit substrate units having a core layer and an asymmetric circuit structure, the asymmetric circuit structure having a first thickness;
    a plurality of embedded components disposed in the core layers; and
    a stress compensation layer disposed on one side of the circuit substrate units, wherein the stress compensation layer has a second thickness, and the embedded type panel substrate has a warpage less than 5 mm,
    wherein the asymmetric circuit structure comprises an upper conductive layer disposed on one side of the core layer and electrically connected to the embedded component, wherein the stress compensation layer is spaced apart from the asymmetric circuit structure, the stress compensation layer contains glass fibers, and the second thickness of the stress compensation layer depends on a product of a residual copper ratio of the asymmetric circuit structure and the first thickness of the asymmetric circuit structure.

2. The structure according to claim 1, wherein the asymmetric circuit structure comprises at least two upper conductive layers and at least one dielectric material layer, wherein the at least two upper conductive layers are disposed on one side of the core layer and electrically connected to the embedded component, and the at least one dielectric material layer is disposed between the at least two upper conductive layers, wherein the second thickness of the stress compensation layer depends on each residual copper ratio and each thickness of the at least two upper conductive layers and a thickness of the at least one dielectric material layer.

3. The structure according to claim 2, wherein the asymmetric circuit structure further comprises a lower conductive layer disposed on the same side of the core layer with the stress compensation layer, and the second thickness of the stress compensation layer further depends on a residual copper ratio and a thickness of the lower conductive layer.

4. The structure according to claim 1, wherein the asymmetric circuit structure further comprises at least two lower conductive layers, wherein the stress compensation layer is disposed between the at least two lower conductive layers, and the second thickness of the stress compensation layer depends on each residual copper ratio and each thickness of the upper conductive layer and the at least two lower conductive layers and the first thickness of the core layer.

5. The structure according to claim 1, wherein a ratio of the second thickness to the first thickness is between 0.03 and 2.9.

6. The structure according to claim 1, wherein a ratio of the second thickness to the first thickness is between 0.03 and 1.17.

7. The structure according to claim 2, wherein a ratio of the second thickness to the first thickness is between 0.42 and 2.58.

8. The structure according to claim 3, wherein a ratio of the second thickness to the first thickness is between 0.18 and 1.152.

9. The structure according to claim 4, wherein a ratio of the second thickness to the first thickness is between 0.57 and 2.9.

10. A manufacturing method of an embedded component package structure, comprising:
    providing a stress compensation layer on one side of a core layer, wherein the core layer has a first thickness, and the stress compensation layer has a second thickness;
    disposing an electrical component in the core layer; and
    forming an asymmetric circuit structure above and below the electrical component, wherein the stress compensation layer is spaced apart from the asymmetric circuit structure, wherein the asymmetric circuit structure comprises an upper conductive layer disposed on one side of the core layer and electrically connected to the embedded component, the stress compensation layer includes a resin material and a plurality of glass fibers, wherein the second thickness of the stress compensation layer is determined based on:

copper thickness of the upper conductive layer×residual copper ratio×copper density/(resin ratio× resin density)+(glass fiber ratio×glass fiber density).

* * * * *